ered Semiconductor
United States Patent [19]

Wong

[11] Patent Number: 5,175,125
[45] Date of Patent: Dec. 29, 1992

[54] METHOD FOR MAKING ELECTRICAL CONTACTS

[75] Inventor: George Wong, Singapore, Singapore

[73] Assignee: Chartered Semiconductor Manufacturing Ltd. Pte, Singapore, Singapore

[21] Appl. No.: 680,156

[22] Filed: Apr. 3, 1991

[51] Int. Cl.⁵ ............................................. H01L 21/44
[52] U.S. Cl. ................................... 437/188; 437/194; 437/198; 437/199; 437/246; 437/247
[58] Field of Search ............... 437/199, 188, 194, 246, 437/247, 203

[56] References Cited

U.S. PATENT DOCUMENTS

| 3,848,330 | 11/1974 | Hall et al. | 437/198 |
| 3,856,647 | 12/1974 | Blachman | 204/192 |
| 4,373,966 | 2/1983 | Kim | 437/198 |
| 4,393,096 | 7/1983 | Gajda | 437/198 |
| 4,495,221 | 1/1985 | Broadbent | 427/88 |
| 4,923,526 | 5/1990 | Harada et al. | 437/194 |
| 4,927,783 | 5/1990 | Arai et al. | 437/199 |

FOREIGN PATENT DOCUMENTS

| 0139939 | 8/1982 | Japan | 437/194 |
| 0088342 | 4/1987 | Japan | 437/194 |
| 0136547 | 6/1988 | Japan | 437/194 |
| 0160036 | 6/1989 | Japan | 437/194 |
| 0276742 | 11/1989 | Japan | 437/194 |
| 0042748 | 2/1990 | Japan | 437/194 |

OTHER PUBLICATIONS

Pramanik et al., "VLSI Metallization Using Aluminum and its Alloys", Solid State Technology, pp. 131-138, Mar. 1983.

Primary Examiner—Brian E. Hearn
Assistant Examiner—Tuan Nguyen
Attorney, Agent, or Firm—George O. Saile

[57] ABSTRACT

The method of forming a highly conductive electrical contact to a semiconductor region of an integrated circuits device is described. An opening to the semiconductor region is provided through an insulating layer. A thin first layer of aluminium having a first grain size is sputter deposited over and in the opening covering the surface of the semiconductor region. A second layer of aluminium having a second and substantially different grain size from the thin first layer of aluminium is sputter deposited thereover. The resulting aluminum structure is subjected in its normal process of manufacture to temperature cycling of greater than about 300° C. whereby any formed silicon nodules are preferentially formed at the boundary of the thin first layer of aluminium and the second layer of aluminium. The second layer of aluminium may in one alternative completely fill the opening. In another alternative, a third layer having substantially the same grain size as the first aluminum. In this last alternative, the third layer will fill the opening to complete the electrical contact. The grain size is adjusted by the bias applied or not applied during the sputter deposition.

13 Claims, 1 Drawing Sheet

METHOD FOR MAKING ELECTRICAL CONTACTS

BACKGROUND OF THE INVENTION

1. Field of the Invention

The invention relates to the manufacture of high density integrated circuits and more particularly to methods and resulting structures for making electrical contacts to semiconductor regions within the integrated circuit.

2. Description of the Prior Art

Metallization is a critical processing technique throughout the integrated circuit process. It is particularly critical in the formation of electrical contacts to semiconductor regions in silicon integrated circuits in the one micron and submicron feature size era.

Some years ago the use of direct aluminium electrical contacts to semiconductor regions in silicon semiconductor devices was predominant. However, aluminium with direct contact to silicon leads to metallurgical interactions causing dissolution of silicon by diffusion into the metal and which in turn leads to boundary interface problems. Also, there is movement of aluminium into the silicon region as well. This interaction between aluminum and silicon is a thermally activated process and depends on the temperature and duration of any heating or annealing.

It became common to include a small percentage, such as 1 or 2 per cent of silicon in the deposition of aluminum to overcome or prevent junction shorts caused by the preferential dissolution of silicon into the aluminum. There are contact failures which occur in these aluminum doped with silicon electrical contact systems. These failures are caused by the precipitation of silicon from the aluminum during cooling. These undesirable silicon precipitates also cause increases in the resistance of the electrical contacts.

Further, the precipitate nodules of silicon are formed preferentially at the boundary of the aluminium to silicon interface. These silicon nodules leads to nonohmic contact problems in addition to the obvious increase of resistance problem. These nodules have the characteristic of growing from small seeds to larger nodules during temperature cycling at temperatures greater than about 300° C.

To overcome these problems of direct aluminum to silicon or aluminum-silicon to silicon electrical contacts the use of barriers between these material have widely begun to be used. Self aligned transition and noble metal silicides of metal such as platinum, palladium, cobalt, nickel, titanium, tantalum, tungsten, etc. have been used as the barrier metal. There are problems with this alternative involving metallurgical interaction, consummation of the shallow silicon semiconductor region, etc. Other barrier materials proposed are titanium nitride, titanium carbide, titanium-tungsten, and the like.

Another alternative to the barrier metal is to have the primary contact metal to be a metal, such as tungsten to the semiconductor region. Then the second level of metallurgy is the more conductive aluminium, which is well away from the silicon semiconductor region. This alternative is finding use particularly in the micron and submicron era. However, there is a loss of conductivity in the use of tungsten over aluminium.

There are several processes to deposit metals for electrical contacts to semiconductor regions. The principal deposition technique used for aluminium is by evaporative deposition in a vacuum chamber using an electron beam directed at the source to vaporize the material. Such a technique is described in E. K. Broadbent U.S. Pat. No. 4,495,221. In this Patent aluminum is deposited, with or without a silicon or copper component wherein a two step method is followed. The first step is to deposit at a lower deposition rate and then a second step is done at a higher deposition rate. The temperature is maintained constant during this process. The purpose of the process is to improve step coverage.

Another process that can be used to deposit metal on to semiconductor devices is by sputtering. The A. G. Blachman U.S. Pat. No. 3,856,647 describes a method for sputter coating a thin refractory metal, such as molybdenum onto a substrate which achieves a minimum resistivity and minimum stress. A first thin refractory metal layer is deposited at a first voltage bias on the substrate and then the thicker layer of refractory metal is deposited over the first layer at a second voltage bias that is different than the first voltage. The method is solely involved with reducing stress in the refractory metal layer being deposited.

It is a primary object of this invention to provide a method for depositing an aluminum or aluminum doped with silicon electrical contact to a semiconductor region of an integrated circuit that overcomes the deficiencies of the prior art.

It is a further object of this invention to provide a method for deposition of aluminum or aluminum doped with silicon electrical contact to a silicon semiconductor region in two or more layers which substantially reduces the precipitation and growth of silicon nodules during temperature cycling of greater than about 300° C. at the interface between the silicon semiconductor region and the aluminum electrical contact.

SUMMARY OF THE INVENTION

The method of forming a highly conductive electrical contact to a semiconductor region of an integrated circuits device is described. An opening to the semiconductor region is provided through an insulating layer. A thin first layer of aluminium having a first grain size is sputter deposited over and in the opening covering the surface of the semiconductor region. A second layer of aluminium having a second and substantially different grain size from the thin first layer of aluminium is sputter deposited thereover. The resulting aluminum structure is subjected in its normal process of manufacture to temperature cycling of greater than about 300° C. whereby any formed silicon nodules are preferentially formed at the boundary of the thin first layer of aluminium and the second layer of aluminium. The second layer of aluminium may in one alternative completely fill the opening. In another alternative, a third layer having substantially the same grain size as the first aluminum. In this last alternative, the third layer will fill the opening to complete the electrical contact. The grain size is adjusted by the bias applied or not applied during the sputter deposition.

A high density integrated circuit having electrical contacts to semiconductor regions therein where each contact is made through an opening in an insulating layer, each said electrical contact is described. A thin first layer of aluminium having a first grain size is provided. A second layer of aluminium having a second and substantially different grain size from the thin first layer of aluminium covers the first layer. Silicon nodules preferentially formed at the boundary of the thin first layer of aluminium and second layer of aluminium which have been caused by a temperature cycling of the integrated circuit structure at temperature more than about 300° C. The second layer of aluminum may fill the opening. Alternatively, a third layer of aluminum having substantially the same grain size as the first layer of aluminum is used over the second layer to fill the opening. Bias or no bias during the sputter deposition controls the grain size.

DESCRIPTION OF THE PREFERRED EMBODIMENTS

Figure 1:
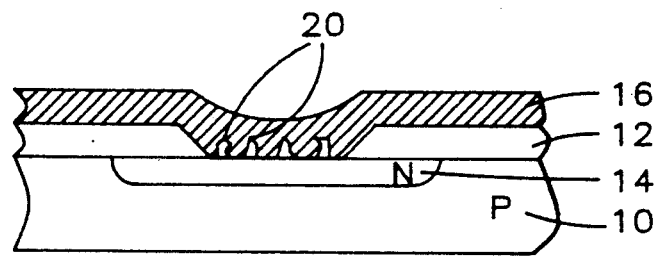
FIG. 1 is a schematic cross sectional view of the electrical contact of the Prior Art wherein silicon nodules have formed at the interface of the aluminum contact metal and the silicon semiconductor region.

Referring now more particularly to FIG. 1, there is shown a cross sectional representation of the Prior Art electrical contact to a semiconductor region in an integrated circuit wherein there are shown the problem of silicon nodules formed at the aluminum to silicon boundary. A P-doped (100) monocrystalline silicon substrate 10 is used. An N+ doped semiconductor region 14 is shown formed in the substrate 10. This region 14 can be any of a number of device regions which form a part of a MOS field effect transistor, a CMOS field effect transistor, a bipolar transistor, etc. An isolating layer 12 is shown on the surface of the substrate 10 with the semiconductor region 14. An opening in this layer 12 allows electrical contact to the semiconductor region 14. An aluminum doped with silicon layer 16 makes ohmic electrical contact to the region 14. There are shown nodules 20 of silicon at the boundary of the layer 16 and the semiconductor region 14. These nodules 20 are precipitates that have been formed by the cooling of the layer 16 after deposition and have increased in size during the temperature cycling greater than about 300° C. that has occurred during normal further processing to complete the integrated circuit structure. These silicon nodules reduce conductivity of the ohmic electrical contact as well as to an extent reducing the ohmic contact to the region 14.

The effects of silicon nodules cause several device quality reducing problems. They reduce the effective contact area and hence increase the contact resistance which, in turn impacts the speed-performance device characteristics. Further, when the nodules are on an N+ contact, the presence of P-doped material, that is aluminum the silicon nodules creates P-N diodes which affect device characteristics.

Figure 2:
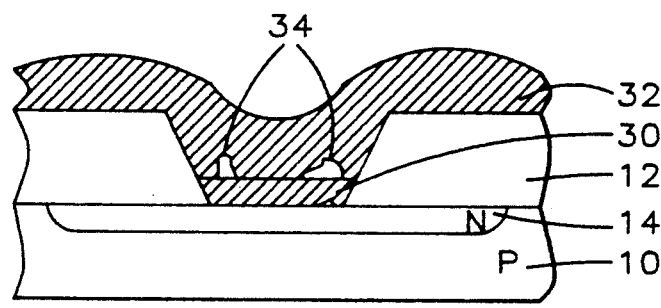
FIG. 2 is a schematic cross sectional view of the electrical contact formed by a first embodiment to overcome the problem of silicon nodule growth at the interface of the aluminum contact metal and the silicon semiconductor region.

Referring now more particularly to FIG. 2 there is shown a schematic cross-sectional representation of a first embodiment of the present invention at an early stage of manufacture. The product under manufacture can be either an N-channel MOSFET, a P-channel MOSFET, a CMOS FET, a bipolar transistor, etc. However, the FIG. 2 process is intended to schematically intended to show a CMOS FET process that makes a electrical contact to an N+ source/drain region. The substrate 10 is monocrystalline silicon and has been doped by conventional techniques to either P or N as is appropriate for the desired N-channel or P-channel MOS FET structure. The substrate 10 can alternatively have an epitaxial layer on its surface or not have such a layer as is known in the art. In FIG. 2 the portion of the substrate shown is P-which is only exemplary. An example of such a conventional CMOS process is described in the book "VLSI TECHNOLOGY" Second Edition by S. M. Sze Published by McGraw-Hill Book Co., New York, N.Y. 1988 Pages 485–487.

Source/drain region 14 is formed by conventional methods as described, for example by Sze cited above in the appropriate wells of substrate 10. An insulating layered structure 12 typically composed of a layer of silicon dioxide and a much thicker layer thereover of borophosphosilicate glass, phosphosilicate glass, a silicon oxide sandwich spin on glass structure, or similar insulating layer. The operational thicknesses of these layers are between about 1000 to 2000 Angstroms for the oxide layer and between about 4000 to 6000 Angstroms for the glasseous layer. These layers are typically deposited by atmospherics chemical vapor deposition or plasma enhanced chemical vapor deposition using the known techniques.

The contact windows or openings are now formed through the insulating layered structure 12 to the source/drain region 14 in the device regions. This process step is conventionally done by lithography and etching techniques which preferably use a reactive ion etching process that will anisotropically etch both components of the layered structure 12. A typical reactive ion etching process uses fluoroform, sulfur hexafluoride and helium in a plasma.

The aluminum electrical contact 30, 32 is now to be formed by the sputter deposition process of the first embodiment of the invention. The wafer containing the semiconductor region 14 with the opening through the layer 12 to this region 14 is placed in a conventional sputtering apparatus.

This sputtering apparatus has a chamber that is evacuated to very low pressures of the order of $1 \times 10^{-7}$ Torr. A small quantity of Argon gas is provided to the system chamber. An high purity aluminum target is provided in the chamber. A small percentage of silicon of the order of 0.8 to 2 percent maybe included in the aluminum target. Further, a small amount of copper of the order of 0.5 to 1 percent may also be included in the target. Radio frequency, D.C. or D.C. magnetron sputtering systems can be used for the aluminum metal deposition. However, it is preferred to use the D.C. magnetron sputtering system because of the complexities associated with radio frequency power supply and impedance matching network, extraneous plasma generation, and interference between radio frequency radiation and electromagnetic radiation. There is a provision in the system to either apply a bias or not to apply a bias during the sputtering of the aluminum.

The layer 30 of the electrical contact is now formed by use of the sputtering system described above. The operational thickness of this layer is between about 500 to 2500 Angstroms and the preferred thickness is between about 100 to 1500 Angstroms. If the thickness is less than about 500 Angstroms there are problems involving insufficient interface due to across wafer and within batch non-uniformity. If the thickness is more than about 2500 Angstroms there are problems with silicon nodules precipitating out into the contact from the bulk aluminum between the interface and the silicon. The process is preferably performed unbiased and the preferred process conditions are: Deposition Rate of 1000 Angstroms/minute; Deposition Pressure of 5 milli-Torr; Deposition Temperature of 160° C.; Deposition Power of 5 kW.; and 0 bias. The grain structure of the resulting layer 30 is in the range of grain size of 1.5 to 2 micrometers.

The layer 32 of the electrical contact is now formed by use of the sputtering system described above. The process is preferably performed biased and the process conditions are except for the presence of bias is the same as for the deposition of layer 30. The bias is 50 watts on the machine which induces a substrate bias of about −60 to −80 volts D.C. The grain structure of the resulting layer 32 is about 0.5 to 1 micrometers grain size. The process continues until the opening is filled with the layer 32 and is also deposited upon the upper surfaces of the layer 12 as is shown in FIG. 2.

The result of this two step sputtering electrical contact process is the formation of a dissimilar grain boundary close to the aluminum to silicon region interface. This boundary has many seeding points for the preferential formation of silicon nodules 34 during the temperature cycling greater than about 300° C. during the normal subsequent processing to complete the formation of the integrated circuit. The formation of such nodules at the aluminum to silicon interface will thereby be substantially reduced together with the problems associated therewith.

Figure 3:
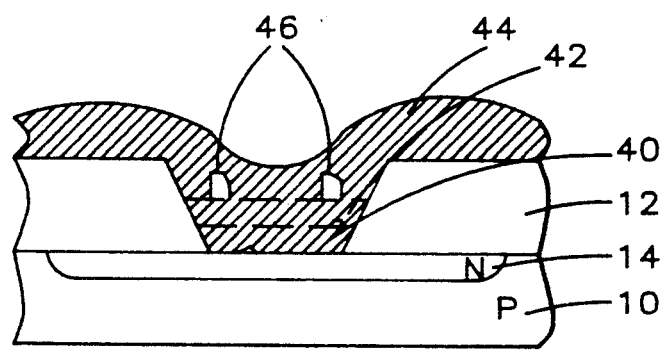
FIG. 3 is a schematic cross sectional view of the electrical contact formed by a second embodiment to overcome the problem of silicon nodule growth at the interface of the aluminum contact metal and the silicon semiconductor region.

Referring to FIG. 3, the second embodiment of the invention uses a three step sputtering process to form the electrical contact 40, 42, 44.

The layer 40 of the electrical contact is now formed by use of the sputtering system described above. The operational thickness of this layer is between about 500 to 2500 Angstroms and the preferred thickness is between about 1000 to 1500 Angstroms. The process is preferably performed unbiased and the process conditions are identical to that for the deposition of layer 30 above. The grain size structure of the resulting layer 40 has grain sizes of between about 1.5 to 2.0 micrometers.

The layer 42 of the electrical contact is now formed by use of the sputtering system described above. The operational thickness of this layer is between about 500 to 2500 Angstroms and the preferred thickness is between about 100 to 1500 Angstroms. The process is preferably performed biased and the process biasing conditions are the same as for the deposition of layer 32 above. The grain size structure of the resulting layer 42 has grain size ranges of about 0.5 to 1.0 micrometers.

The layer 44 of the electrical contact is now formed by use of the sputtering system described above. The process is preferably performed unbiased and the process conditions are the same as that of the first layer 40 deposition. The grain structure of the resulting layer 44 is substantially identical to that of layer 40. The process continues until the opening is filled with the layer 44 and is also deposited upon the upper surfaces of the layer 12 as is shown in FIG. 3.

The result of this three step sputtering electrical contact process is the formation of a (1) dissimilar grain boundary close to the aluminum to silicon region interface and (2) a second dissimilar between layers two and three further away from the aluminum to silicon interface. These boundaries have many seeding points for the preferential formation of silicon nodules 46 during the temperature cycling greater than about 300° C. which occur during the normal subsequent processing to complete the formation of the integrated circuit. The formation of such nodules at the aluminum to silicon interface will thereby be substantially reduced together with the problems associated therewith.

While the invention has been particularly shown and described with reference to the preferred embodiments thereof, it will be understood by those skilled in the art that various changes in form and details may be made without departing from the spirit and scope of the invention.

What is claimed is:

1. The method of forming a highly conductive electrical contact to a silicon semiconductor region of an integrated circuits device comprising:
   providing an opening to said semiconductor region through an insulating layer;
   sputter depositing in said opening a thin first layer of aluminium having a first grain size;
   sputter depositing in said opening a second layer of aluminium having a second and substantially different grain size from the said thin first layer of aluminium;
   wherein said first layer is greater in thickness than about 500 and less than about 1500 Angstroms and the first grain size is between about 1.5 to 2.0 micrometers and the second grain size is between about 0.5 to 1.0 micrometers; and
   subjecting the resulting structure to temperature cycling of greater than about 300° C. whereby any formed silicon nodules are preferentially formed at the boundary of the said thin first layer of aluminium and said second layer of aluminium.

2. The method of claim 1 wherein the said first layer is formed by sputtering without any bias being applied to thereby form a relatively large grain sized aluminium layer and the said second layer is formed by sputtering with a bias being applied to thereby form a relatively small grain sized aluminium layer.

3. The method of claim 1 wherein the said first and second aluminium layers contain small amounts of silicon and copper.

4. The method of claim 1 wherein the said second layer completely fills said opening and completes the first level said electrical contact to the semiconductor region.

5. The method of claim 1 and further comprising the sputter depositing in said opening of a third aluminium layer having substantially the same grain size as said first aluminium and continuing said depositing of a third aluminium layer until the said opening is filled to complete said electrical contact to the semiconductor region.

6. The method of claim 5 wherein the said first and third aluminium layers are sputter deposited in an unbiased condition to form a relatively large grain size aluminium layers and the second aluminium layer is sputter deposited in a biased condition to form a relatively small grain size aluminium layer.

7. The method of claim 1 wherein said semiconductor region is the semiconductor substrate of said integrated circuit device.

8. The method of claim 1 wherein said semiconductor region is a polysilicon region of said integrated circuit device.

9. The method of forming a highly conductive electrical contact to a silicon semiconductor region of an integrated circuits device comprising:
provided an opening to said semiconductor region through an insulating layer;
sputter depositing in said opening a thin first layer of aluminium having a first grain size; sputter depositing in said opening a second layer of aluminium having a second and substantially different grain size from the said thin first layer of aluminium;
sputter depositing in said opening a third layer of aluminium having a substantially identical grain size to that of the said thin first layer of aluminium and continuing the depositing until the said opening is filled and the said electrical contact to semiconductor region is completed;
wherein said first layer is greater in thickness than about 500 and less than about 1500 Angstroms and the second layer is between about 500 to 2500 Angstroms in thickness, and the first grain size is between about 1.5 to 2.0 micrometers, said second grain size is between about 0.5 to 1.0 micrometers and the grain size of said third layer is between about 1.5 to 2.0 micrometers; and subjecting the resulting structure to temperature cycling of greater than about 300° C. whereby any formed silicon nodules are either preferentially formed at the boundary of the said thin first layer of aluminium and said second layer of aluminium or the boundary of the said second layer of aluminium and the third layer of aluminium.

10. The method of claim 9 wherein the said first layer and third layer are formed by sputtering without any bias being applied to thereby form a relatively large grain sized aluminium layer and the said second layer is formed by sputtering with a bias being applied to thereby form a relatively small grain sized aluminium layer.

11. The method of claim 9 wherein the said first, second and third aluminium layers contain small amounts of silicon and copper.

12. The method of claim 9 wherein said semiconductor region is the semiconductor substrate of said integrated circuit device.

13. The method of claim 9 wherein said semiconductor region is a polysilicon region of said integrated circuit device.

* * * * *